(12) United States Patent
Vaysset et al.

(10) Patent No.: US 10,164,077 B2
(45) Date of Patent: Dec. 25, 2018

(54) MAGNETIC MAJORITY GATE DEVICE

(71) Applicants: IMEC VZW, Leuven (BE); Katholieke Universiteit Leuven, Leuven (BE)

(72) Inventors: Adrien Vaysset, Leuven (BE); Mauricio Manfrini, Heverlee (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 15/693,243

(22) Filed: Aug. 31, 2017

(65) Prior Publication Data

US 2018/0061970 A1   Mar. 1, 2018

(30) Foreign Application Priority Data

Aug. 31, 2016   (EP) .................................. 16186477

(51) Int. Cl.
*H01L 29/66*   (2006.01)
*H03K 19/23*   (2006.01)
(Continued)

(52) U.S. Cl.
CPC ........ *H01L 29/66984* (2013.01); *B82Y 10/00* (2013.01); *G11C 11/161* (2013.01);
(Continued)

(58) Field of Classification Search
CPC ........... H01L 29/66984; H01L 29/0673; H01L 43/08; H01L 27/22; G11C 11/16; G11C 11/161; H03K 19/18; H03K 19/23
See application file for complete search history.

(56) References Cited

U.S. PATENT DOCUMENTS 8,933,521 B2 *   1/2015   Nikonov ................. H01L 27/22
                                                    257/421
9,559,698 B2 *   1/2017   Nikonov ........... H01L 29/66984
(Continued)

OTHER PUBLICATIONS

Breitkreutz, S. et al. "Domain Wall Gate for Magnetic Logic and Memory Application with Perpendicular Anisotropy", *IEEE* International Electron Devices Meeting, 2013; 4 pages.
Gerhardt, T. et al., "Controlled pinning and depinning of domain walls in nanowires with perpendicular magnetic anisotropy", *Journal of Physics: Condensed Matter* 24 (2012) 024808, 9 pages.
Holleitner, A. W., et al., "Pinning a domain wall in (Ga, Mn) as with focused ion beam lithography", *Applied Physics Letters*, vol. 85, No. 23, Dec. 6, 2004; 4 pages.
(Continued)

*Primary Examiner* — Allison P Bernstein
(74) *Attorney, Agent, or Firm* — Knobbe, Martens, Olson & Bear LLP

(57) ABSTRACT

The disclosed technology relates generally to spintronics, and more particularly to a magnetic majority gate device. In one aspect, a magnetic majority gate device includes a magnetic propagation layer and at least one input transducer. The magnetic propagation layer includes a plurality of magnetic buses configured to guide propagating magnetic domain walls along longitudinal directions corresponding to elongated directions of the magnetic buses. The plurality of magnetic buses includes a plurality of input magnetic buses, where each of the input magnetic buses has a corresponding input site configured to receive a corresponding input magnetic domain wall. At least one input transducer at a corresponding input site is configured to convert a digital input electrical signal into an input magnetic domain wall, such that a magnetization state of the input magnetic domain wall corresponds to a digital logic state of the digital input electrical signal. The at least one input transducer is configured to inject an in-plane electrical current into the
(Continued)

corresponding input magnetic bus if the digital logic state is a predetermined digital logic state. The magnetic propagation layer includes a central region at which the magnetic buses converge and are joined together, such that the central region is configured for an interaction of input magnetic domain walls guided by two or more magnetic buses. The central region includes at least one magnetic constriction configured to locally restrict propagation of propagating magnetic domain walls.

20 Claims, 5 Drawing Sheets

(51) Int. Cl.
  *H03K 19/18* (2006.01)
  *G11C 11/16* (2006.01)
  *B82Y 10/00* (2011.01)
  *H01L 29/06* (2006.01)

(52) U.S. Cl.
  CPC ......... *H01L 29/0673* (2013.01); *H03K 19/18* (2013.01); *H03K 19/23* (2013.01)

(56) References Cited

U.S. PATENT DOCUMENTS

| | | | |
|---|---|---|---|
| 9,979,402 B2* | 5/2018 | Vaysset | H01L 43/08 |
| 2017/0337983 A1* | 11/2017 | Wang | G11C 19/0841 |
| 2018/0130510 A1* | 5/2018 | Vaysset | G11C 11/16 |

OTHER PUBLICATIONS

Nikonov, D. et al., "Cascade-able spin torque logic gates with input-output isolation", *The Royal Swedish Academy of Sciences, Physica Scripta*, 90 (2015), 074047, 11 pages.

Nikonov, D. et al., "Proposal of a Spin Torque Majority Gate Logic", *IEEE Electron Device Letters*, vol. 32, No. 8, Aug. 2011; pp. 1128-1130.

Nikonov, D. et al., "Switching efficiency improvement in spin torque majority gates", *Journal of Applied Physics* 115, 17C736 (2014); 4 pages.

* cited by examiner

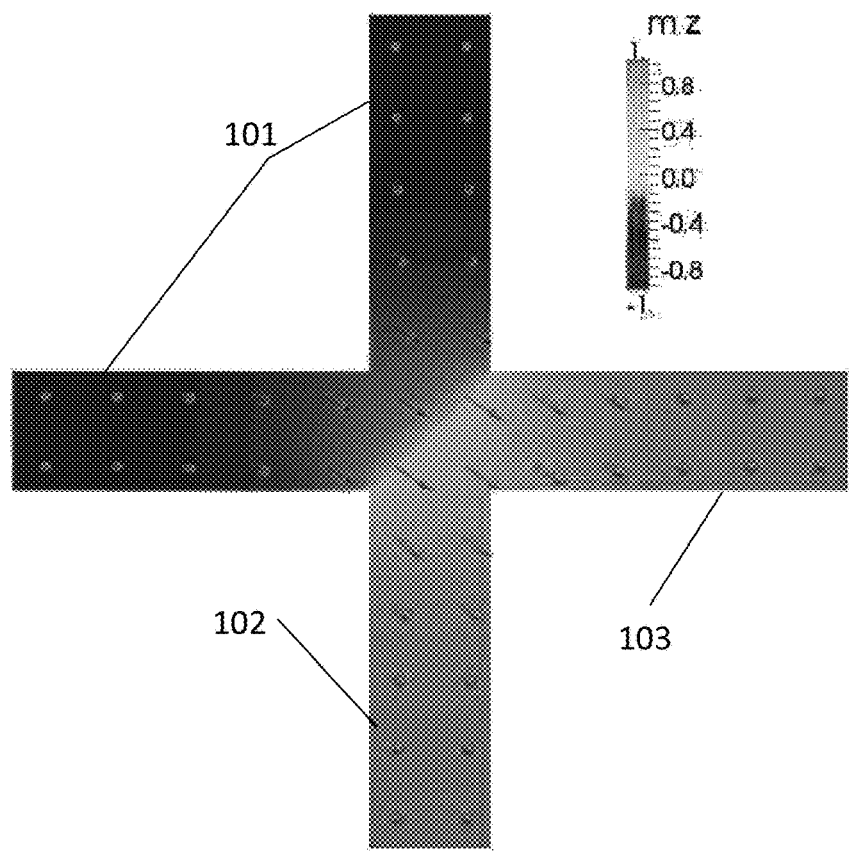
FIG 1 – PRIOR ART
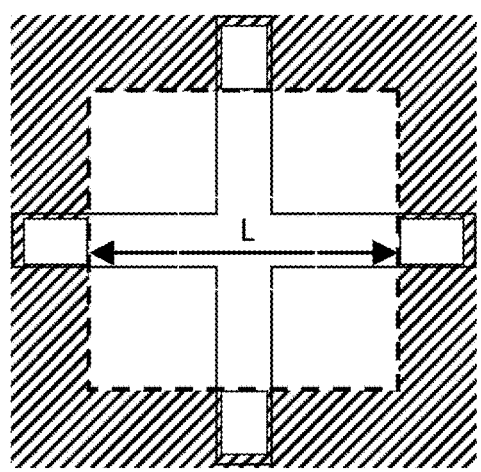
FIG 2 – PRIOR ART

MAGNETIC MAJORITY GATE DEVICE

CROSS-REFERENCE TO RELATED APPLICATIONS

This application claims foreign priority to European Patent Application No. EP 16186477.2, filed Aug. 31, 2016, the content of which is incorporated by reference herein in its entirety.

BACKGROUND

Field

The disclosed technology relates generally to spintronics, and more particularly to a magnetic majority gate device, e.g., a spin transfer torque majority gate device, and related methods.

Description of the Related Technology

In the development of complementary metal oxide semiconductor (CMOS) logic circuits, reducing or minimizing an increase in power density while scaling down component devices, e.g., CMOS transistors, poses an increasingly difficult challenge. As a result, alternatives to CMOS-based logic circuits have been proposed. One such alternative involves spintronic devices, which have been proposed to potentially offer advantages over traditional CMOS logic, including lower power density. In spintronic devices, magnetization states, e.g., in the form of magnetic quasiparticle waves and/or collective magnetic excitation waves, are used to convey a signal instead of the electric charge. For example, an electric charge representative of an input logic state may generate a propagating domain wall, e.g., using the effect of spin-transfer torque applied by a magnetic tunnel junction. The propagating magnetic state carried by the domain wall may then be used in a spintronic logic circuit, and converted back to an electric charge representative of an output logic state, e.g., using a tunnel magnetoresistance effect detectable by another magnetic tunnel junction.

Some spintronic majority gate devices have been proposed to reduce the complexity at the circuit level by compact implementation at the device level. For example, in "Proposal of a Spin Torque Majority Gate Logic," by Nikonov et al., *IEEE Electron Device Letters* 32 (8), a spin torque majority gate is disclosed that can, in principle, realize an operation that would otherwise necessitate at least 14 transistors in a conventional CMOS circuit. Spin-based logic circuitry can therefore potentially provide lower power consumption and compact circuitry, e.g., relative to conventional CMOS circuits. Another advantage of some spintronic majority gate devices is that such magnetic majority gate devices can be compatible with various aspects of CMOS technology, including fabrication. For example, some parts of the logic circuitry that includes spintronic majority gate devices can be advantageously integrated in a chip design at the interconnect level, thereby allowing further stacking, such that the footprint can be reduced even further.

The device disclosed by Nikonov et al. comprises a common free ferromagnetic layer having, e.g., an out-of-plane magnetization, and four discrete ferromagnetic nanopillars, where each of the nanopillars contains an independent fixed layer. These nanopillars may form magnetic tunnel junctions (MTJ), where three MTJs are used for writing input states using spin transfer torque, and one MTJ is used for reading out an output state using tunnel magnetoresistance. In the majority gate that is thus formed, domain walls generated by spin transfer torque propagate through the free ferromagnetic layer, thereby merging at a central region, to return an output state indicative of a majority selector. The domain walls may be characterized by the propagation of two possible magnetization states over the free layer, referred to as DOWN and UP, encoding for complementary logic information bits 0 and 1.

However, in the spin torque majority gate device proposed by Nikonov et al., certain input combinations may fail to return the expected result, e.g., if the device length L is larger than about $5.5*\sqrt{A_{ex}/K_{eff}}$, where $A_{ex}$ is the exchange constant and $K_{eff}$ is the effective anisotropy. This operating condition on the device length L, referring to the distance between opposite, outer edges of the free ferromagnetic layer, as depicted in FIG. 2, has been derived analytically and confirmed by simulations. Therefore, it is preferable in such device to minimize the physical size of the device.

Such failure mode is illustrated by FIG. FIG. 1, which shows a final state after domain wall propagation, e.g., after 26 ns, after two DOWN states 101 and one UP state 102 were provided as input. In the illustrated example, due to a propagation failure of the input states, the output state 103 is incorrectly resolved as an UP state. In this simulated example, the device had a ferromagnetic strip width of 10 nm and a lateral length of 70 nm.

Without being bound to any theory, this failure mode may be explained by a magnetic domain wall (DW) pinned at the center of the device, thus preventing the majority magnetic domain to propagate toward and into the output zone. For realistic material parameters, very narrow devices, e.g., devices having critical dimensions (CD) smaller than 20 nm, may be needed to avoid these failures in operation. Therefore, manufacture of such device could be challenging with current technologies, and even small variations in device CD can result in large variations of device performance.

For example, while a cross-shaped spin torque magnetic gate, such as that disclosed by Nikonov et al., is in principle very scalable, e.g., being functional at the macrospin scale, practical issues may arise at small sizes. Similar to difficulties encountered in scaling spin torque transfer magnetic random access memory (STT-MRAM) structures, magnetic properties may be altered by physical damages resulting from etching at small scales. Furthermore, for smaller scales, roughness and quantum effects may have a significant effect on the device. Currently, diameter sizes of less than 15 nm appear to be difficult to achieve. Nevertheless, without being bound to any theory, variations due to roughness and/or anisotropy may have little influence at macrospin sizes, e.g., for a ferromagnetic free layer track width of 10 nm. For small sizes, e.g., a few times or less than the exchange length, the magnetization may be substantially uniform. For such small scales, the magnetization may be approximated as a single spin, i.e. a macrospin, due to lack of space for non-uniform magnetization. Local defects, such as roughness, therefore may not have a substantial impact on such small scales, since the magnetization behaves as a single spin state.

In another publication by Nikonov et al., "Cascade-able spin torque logic gates with input-output isolation," in *Physica Scripta* 90 (7), such problems of cascade-ability and input-output isolation, manifesting as domain walls stopping, reflecting off ends of wires or propagating back to the inputs, were recognized. A new approach was disclosed in this publication based on in-plane domain wall automotion in interconnects, exchange coupling of magnetization between two ferromagnetic layers, and a round-about topology for the majority gate. However, it is a disadvantage of such approach that such device may be more complex to manufacture and may be more complex to use in an integrated device.

SUMMARY OF CERTAIN INVENTIVE ASPECTS

It is an object of embodiments of the present disclosure to provide easy to manufacture, simple and robust magnetic majority gate devices and related methods.

The above objective is accomplished by a method and device according to the present disclosure.

It is an advantage of embodiments of the present disclosure that a magnetic majority gate device can be manufactured using complementary metal oxide semiconductor (CMOS) compatible technology.

It is an advantage of embodiments of the present disclosure that a low power consumption density can be achieved in a majority gate device, e.g., a low power consumption combined with a compact footprint, for example when compared to conventional electronic CMOS implementations of a majority gate.

It is an advantage of embodiments of the present disclosure that a majority gate device is provided that can be used for building any Boolean operation by an appropriate combination of such majority gates and logical inverters, e.g., where complex NAND and NOR circuits may be required in conventional logic circuits. Therefore, it is a further advantage that compact logic circuits can be achieved.

It is an advantage of embodiments of the present disclosure that a majority gate device can be constructed that is substantially smaller than conventional CMOS majority gate devices in CMOS logic circuits, e.g., providing a simple integrated device that can be used as an alternative to a complex construct, e.g., requiring at least 15 transistors, based on conventional CMOS circuitry.

It is an advantage of embodiments of the present disclosure that reliable operation can be achieved over a wide range of dimensions of the device, e.g., the device may be scaled down in size easily, yet does not necessarily require small dimension features which might be difficult to manufacture.

It is an advantage of embodiments of the present disclosure that a majority gate device can be integrated in a chip design at the interconnect level.

It is an advantage of embodiments of the present disclosure that a spintronic majority gate device is provided that allows reliable propagation of domain walls. For example, a device in accordance with embodiments can be resilient to domain wall pinning, while allowing critical dimensions (CD) larger than 20 nm. It is a further advantage that a reliable majority gate device can be provided, that is robust to small variations of CD in manufacture. For example, a small device may be provided, e.g., having a distance in the range of 20 nm to 150 nm, e.g., 20 nm to 100 nm, e.g., 20 nm to 50 nm, between I/O transducers, such that an easy to manufacture device is provided having a footprint considerably smaller than an alternative, conventional implementation.

It is an advantage of embodiments of the present disclosure that a spintronic majority gate device is provided that can have a simple geometry, suitable for easy and efficient manufacture using standard photolithography techniques.

It is an advantage of embodiments of the present disclosure that a spintronic majority gate device is provided that can be used to implement non-volatile logic circuits for normally-off computing.

It is an advantage of embodiments of the present disclosure that a spintronic majority gate device is provided that may provide a good cascadability, e.g., providing a possibility to cascade directly at the output strip, e.g., using an output strip of a first gate device directly as an input of a next gate device.

It is an advantage of embodiments of the present disclosure that reliable one-way propagation of domain walls, e.g., continuously and unidirectionally from input sites to an output site, in a magnetic majority gate device can be achieved.

It is an advantage of embodiments of the present disclosure that a device can function under large effective anisotropy, e.g., can have a good thermal stability. Therefore, a large retention time can be achieved, suitable for non-volatile logic devices.

In a first aspect, the present disclosure relates to a magnetic majority gate device comprising a magnetic propagation layer that comprises a plurality of magnetic buses for guiding propagating magnetic domain walls along a longitudinal direction of the magnetic bus. The plurality of magnetic buses comprises a plurality of input magnetic buses having corresponding input sites for receiving corresponding input magnetic domain walls. The device further comprises at least one input transducer for converting a digital input electrical signal into an input magnetic domain wall at a corresponding input site, such that a magnetization state of the input magnetic domain wall corresponds to a digital logic state of the digital input electrical signal. The input transducer is furthermore adapted for injecting an in-plane electrical current into the input magnetic bus if the digital logic state is a predetermined digital logic state. The magnetic propagation layer further comprises a central region to which the plurality of magnetic buses converge and in which the plurality of magnetic buses are joined together such as to allow an interaction of the input magnetic domain walls. The central region comprises at least one magnetic constriction for locally restricting propagation of the propagating magnetic domain walls.

In a magnetic majority gate device in accordance with embodiments of the first aspect of the present disclosure, the plurality of input magnetic buses may consist of an odd number of input magnetic buses.

In a magnetic majority gate device in accordance with embodiments of the first aspect of the present disclosure, the plurality of magnetic buses may furthermore comprise at least one output magnetic bus, in which the central region of the magnetic propagation layer may be adapted for allowing a further propagation of a resultant magnetic domain wall formed by the interaction of the input magnetic domain walls into the at least one output magnetic bus.

In a magnetic majority gate device in accordance with embodiments of the first aspect of the present disclosure, the at least one output magnetic bus may consist of one output magnetic bus.

In a magnetic majority gate device in accordance with embodiments of the first aspect of the present disclosure, the plurality of input magnetic buses may consist of three input magnetic buses.

In a magnetic majority gate device in accordance with embodiments of the first aspect of the present disclosure, the plurality of buses may be configured in a cross shape, wherein the three input magnetic buses and the one output magnetic bus are joined in the central region forming a center of the cross shape.

A magnetic majority gate device in accordance with embodiments of the first aspect of the present disclosure may further comprise at least one output transducer for converting the resultant magnetic domain wall into an output electrical signal, wherein the or each output magnetic bus is coupled to a corresponding output transducer.

In a magnetic majority gate device in accordance with embodiments of the first aspect of the present disclosure, the plurality of magnetic buses may comprise a plurality of nanostrips and/or nanowires.

In a magnetic majority gate device in accordance with embodiments of the first aspect of the present disclosure, the magnetic propagation layer may comprise a ferromagnetic, ferrimagnetic and/or anti-ferromagnetic free layer on a substrate.

A magnetic majority gate device in accordance with embodiments of the first aspect of the present disclosure may further comprise a tunnel barrier layer arranged on the magnetic propagation layer. In such device, the magnetic propagation layer may furthermore be arranged on a substrate, such that the propagating magnetic domain walls are isolated in the magnetic propagation layer.

In a magnetic majority gate device in accordance with embodiments of the first aspect of the present disclosure, each of the magnetic buses may have a width in the range of 10 nm to 100 nm.

In a magnetic majority gate device in accordance with embodiments of the first aspect of the present disclosure, the at least one input transducer may be adapted for generating the input magnetic domain wall by using a spin transfer torque effect induced by an electric field.

In a magnetic majority gate device in accordance with embodiments of the first aspect of the present disclosure, at least one of the input magnetic buses may be configured to receive an input magnetic domain wall from an output magnetic bus of another magnetic majority gate device in accordance with embodiments of the first aspect of the present disclosure.

In a magnetic majority gate device in accordance with embodiments of the first aspect of the present disclosure, a plurality of the magnetic constrictions may be arranged at corners where the plurality of input magnetic buses are joined to form the central region.

In a magnetic majority gate device in accordance with embodiments of the first aspect of the present disclosure, a plurality of the magnetic constrictions may be arranged at corners where the plurality of magnetic buses are joined to form the central region.

In a magnetic majority gate device in accordance with embodiments of the first aspect of the present disclosure, the at least one magnetic constriction may comprise a local non-magnetic inclusion in the magnetic propagation layer, a local dislocation in the crystallographic structure of the magnetic propagation layer and/or a local cavity in the magnetic propagation layer, e.g., such as to form a pinning site in or near the central region.

In a magnetic majority gate device in accordance with embodiments of the first aspect of the present disclosure, the at least one magnetic constriction may comprise a magnetic constriction created by local ion irradiation of the magnetic propagation layer.

In a second aspect, the present disclosure also relates to a method for operating a magnetic majority gate device according to any of the previous claims. This method comprises initializing the plurality of input buses to a first predetermined magnetization state, providing the digital input electrical signal to the at least one input transducer to generate the input magnetic domain wall at each corresponding input site where the digital input electrical signal corresponds to a predetermined digital logic state, and injecting the in-plane electrical current into the input magnetic bus at the corresponding input site if the digital input electrical signal corresponds to the predetermined digital logic state.

Particular and preferred aspects of the disclosure are set out in the accompanying independent and dependent exemplary claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE DRAWINGS

FIG. 1 shows a failure mode in a simulated majority gate device as known in the art.

FIG. 2 illustrates a prior art magnetic majority gate device.

Figure 3:
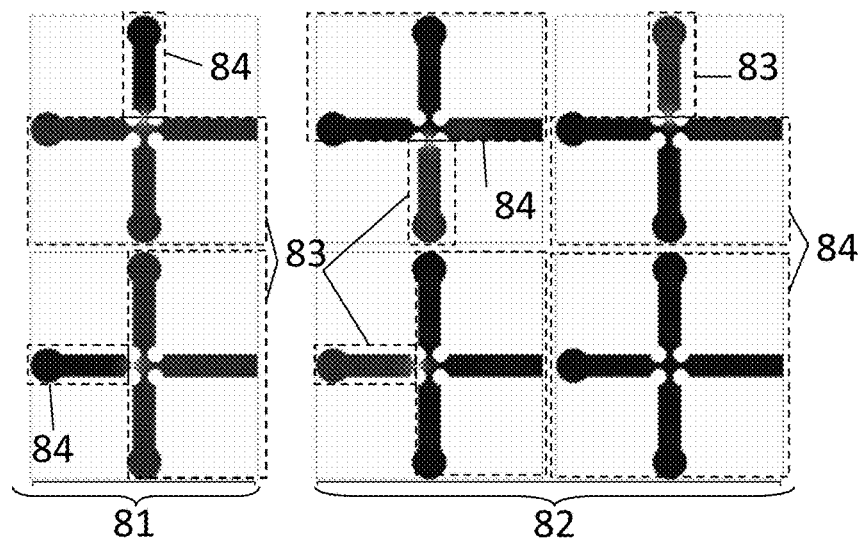
FIG. 3 shows micromagnetic simulations of various possible combinations of input states for an exemplary majority gate device in accordance with embodiments of the present disclosure, in which the output magnetic bus has reached a final state representative of the majority domain.

The drawings are only schematic and are non-limiting. Furthermore, the size of some of the elements may be exaggerated and not drawn to scale.

Any reference signs in the claims shall not be construed as limiting the scope.

In the different drawings, the same reference numerals refer to the same or similar features throughout the specification.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that a claimed invention requires more features than are expressly recited in each exemplary claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Figure 4:
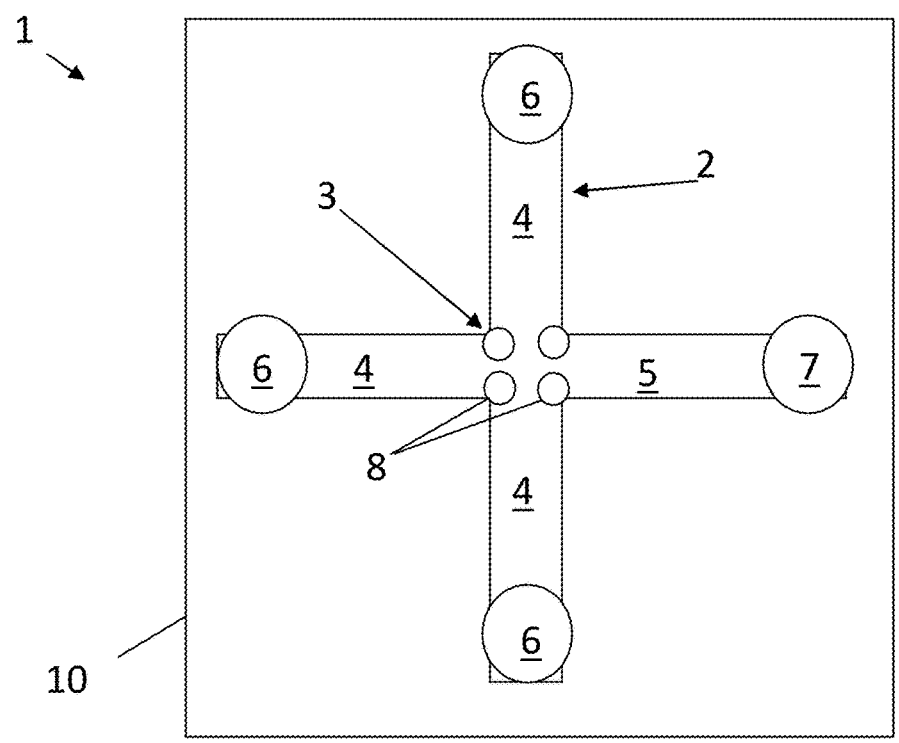
FIG. 4 shows a plan view of a majority gate device in accordance with embodiments of the present disclosure.

In a first aspect, in reference to FIG. 4 without limitation, embodiments of the present disclosure relate to a magnetic majority gate device 1. This device 1 comprises a magnetic propagation layer 2 comprising a plurality of magnetic buses 4,5, e.g., a plurality of elongate structures such as nanostrips or nanowires, adapted for guiding propagating magnetic domain walls, e.g., domain walls, along a longitudinal direction, e.g., along an elongated or lengthwise direction of the each of the magnetic buses.

Such magnetic bus may also be referred to as a magnetic waveguide, e.g., an element composed of a material having suitable magnetic properties for allowing a magnetic domain wall to propagate therein or thereon in a guided manner.

A domain wall may refer to a topological soliton which occurs when a discrete symmetry is spontaneously broken. As described herein, magnetic domain wall refers to an interface region, a boundary region or a transition region separating different magnetic domains or separating adjacent magnetic domains having different magnetic moments. For example, the domain wall may separate magnetic domains that have magnetic moments that are displaced by, e.g., 90 degrees or 180 degrees. Without being bound to any theory, a domain wall may span about 100 to 150 atoms, depending on the anisotropy of the magnetic material. Such magnetic domain wall may propagate through or via a medium formed by the magnetic bus, e.g., a magnetic waveguide adapted for transmitting, guiding and/or conducting such domain walls.

The plurality of magnetic buses 4,5 comprises a plurality of input magnetic buses 4 having corresponding input sites for receiving corresponding input magnetic domain walls. The plurality of magnetic buses may also comprise at least one output magnetic bus 5, e.g., one output magnetic bus.

The magnetic majority gate device further comprises at least one input transducer 6 for converting a digital input electrical signal into the input magnetic domain walls at a corresponding input site of the plurality of input sites (e.g., a plurality of input transducers for respectively generating the input magnetic domain walls at the plurality of input sites), such that a magnetization state of this input magnetic domain walls corresponds to a digital logic state of the digital input electrical signal. Thus, at at least one of the input sites, e.g., at each of the input sites, an input transducer may be provided.

The input transducer is further adapted for injecting an in-plane electrical current into the input magnetic bus (e.g., at the corresponding input site), if, e.g., if and/or only if, the digital logic state is a predetermined digital logic state, e.g., a logic "1" state.

For example, each input transducer may be adapted for generating an in-plane electrical current between the input magnetic bus, e.g., at the corresponding input site, and at least the central region described further below, e.g., between the input magnetic bus and an output magnetic bus, e.g., between the corresponding input site and an output site. Without being bound to any theory, the injected in-plane electrical current $I_{in}$ may be selected such that $2I_t/(n+1) < I_{in} < 2I_t/(n-1)$, in which $I_t$ refers to a threshold current for overcoming a pinning condition of the at least one magnetic constriction described further below, and n refers to the number of input magnetic buses.

The magnetic propagation layer further comprises a central region 3 in which the plurality of magnetic buses converge and are joined together such as to allow an interaction of the input magnetic domain walls when received from the plurality of input buses. Furthermore, this central region may be configured to allow a further propagation of a resultant magnetic domain wall formed by this interaction into the at least one output magnetic bus. This central region 3 furthermore comprises at least one magnetic constriction 8 for locally restricting a propagation path of the propagating domain walls.

For example, in operation, the central region 5 may, initially, have a uniform state. Then, a plurality of magnetic domain walls may merge in the central region and propagate toward an output region via the at least one, e.g., one, output magnetic bus.

In some embodiments, a magnetic constriction 8 comprises a non-magnetic inclusion in the magnetic bus, e.g., in the volume of ferromagnetic material forming the magnetic bus. In some other embodiments, the magnetic constriction includes a structure configured to create a disturbance of the magnetic properties of the magnetic bus, e.g., crystallographic defects such as a dislocation in crystallographic structure. Such magnetic constriction or a combination of such magnetic constriction may form a pinning site which may cause pinning of domain walls, e.g., cause the magnetic domain wall to be at a local energy minimum, such that an external perturbation (such as an external magnetic and/or electric field, e.g., a perturbation caused by applying a current or voltage . . . ) may be applied to depin the domain wall from its pinned position. The act of depinning may thus cause a sudden movement of the domain wall and a sudden change of the volume of both neighbouring domains.

Figure 5:
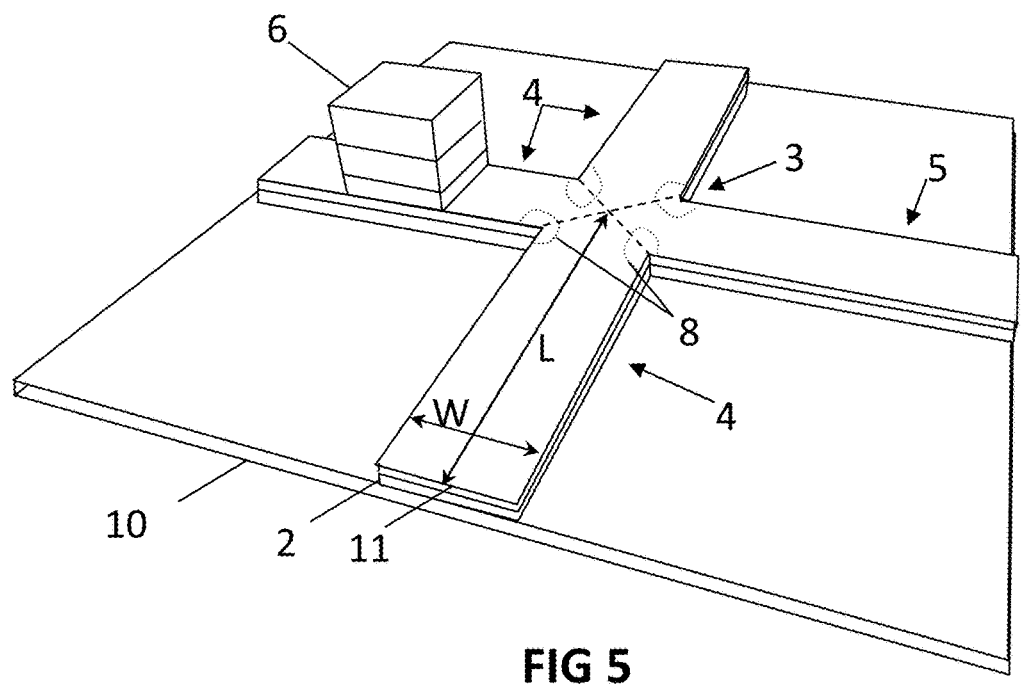
FIG. 5 illustrates a perspective view of a majority gate device in accordance with embodiments of the present disclosure.

Referring to FIG. 4 and FIG. 5, an exemplary magnetic majority gate device 1 in accordance with embodiments of the present disclosure is shown. In the illustrated embodiment, the magnetic majority gate device may be a spin transfer torque majority gate device.

The magnetic majority gate device comprises a magnetic propagation layer 2. For example, this magnetic propagation layer 2 may comprise a ferromagnetic, ferrimagnetic and/or anti-ferromagnetic free layer (e.g., composed of a ferromagnetic material, anti-ferromagnetic material or composite of several such materials, such as, for example, Co alloys or Heusler alloys, embodiments of present disclosure not being limited thereto) suitable for conducting a propagating magnetic domain wall, e.g., a domain wall propagating in and/or over the magnetic propagation layer. The magnetic propagation layer 2 may have a magnetization direction perpendicular to the plane orientation of the magnetic propagation layer, e.g., such as to support two stable magnetization states, referred to as 'UP' and 'DOWN'.

For example, domain walls may propagate in and/or over the magnetic propagation layer 2, e.g., domain walls formed by a moving transition region between two magnetic domains in which magnetic moments gradually change direction from a first magnetization state that is substantially orthogonal to the plane of the magnetic propagation layer to a second magnetization state that is also substantially orthogonal to the plane of the magnetic propagation layer but oppositely oriented with respect to the first magnetization state. However, embodiments of the present disclosure are not necessarily limited to magnetization states that are substantially orthogonal to the plane of the magnetic propagation layer, e.g., may equally relate to in-plane magnetization states and domain walls formed by a transition between two different of such in-plane magnetization states.

Due to constrained energy states, e.g., a physical preference of energetically favorable states, this transition region may have a finite, non-zero length over which the magnetic moments cant from the first magnetization state to the second magnetization state, e.g., such as to form a Bloch domain wall or a Néel domain wall.

The magnetic propagation layer may be provided on a substrate 10 and/or a suitable bottom electrode, e.g., the magnetic majority gate device 1 may comprise a substrate on which the magnetic propagation layer 2 is provided, e.g., a substrate suitable for isolating the propagation of the magnetic domain wall in the magnetic propagation layer 2.

The magnetic majority gate device 1 may comprise a tunnel barrier layer 11, e.g., a tunnel dielectric layer, on the magnetic propagation layer 2. Such tunnel barrier layer may comprise a suitable barrier oxide, e.g., $MgO$, $Al_2O_3$, $BaTiO_3$, or similar dielectric materials, for example having a thickness, e.g., in the range of 0.5 nm to 5 nm or 1 nm to 2 nm.

The magnetic propagation layer 2 comprises a plurality of magnetic buses. For example, such magnetic bus may comprise a nanostrip or nanowire. Such magnetic bus may be formed by shaping the magnetic propagation layer, e.g., by etching the magnetic propagation layer in a suitable shape to form elongate magnetic bus structures. Each magnetic bus is adapted for guiding a propagating magnetic domain wall along a longitudinal direction, e.g., a lengthwise direction, of this magnetic bus.

For example, each magnetic bus may have a width W in the range of 10 nm to 100 nm, e.g., in the range of 15 nm to 50 nm, e.g., in the range of 20 nm to 40 nm. It is an advantage of embodiments of the present disclosure that a spintronic majority gate device is provided that is robust against failure of propagation of domain walls, while allowing critical dimensions (CD) larger than 20 nm. It is a further advantage that a reliable majority gate device can be provided, that is robust to small variations of CD in manufacture.

Each magnetic bus may have a length L in the range of 20 nm to 150 nm, e.g., 20 nm to 100 nm, e.g., 20 nm to 50 nm. Therefore, a reliable majority gate device can be provided that has dimensions which can be manufactured, e.g., having width and length dimensions of the magnetic buses of at least 10 nm, e.g., at least 20 nm, while still having a footprint considerably smaller than a conventional electrical implementation of such majority gate device.

The plurality of magnetic buses comprises a plurality of input magnetic buses 4 having corresponding input sites for receiving corresponding input magnetic domain walls. The plurality of magnetic buses may also comprise at least one output magnetic bus 5. Such at least one output magnetic bus 5, e.g., a single output magnetic bus, may have a corresponding output site for transmitting a corresponding output magnetic domain wall to an external receiver, e.g., in the form of this output magnetic domain wall or in a different form such as an electric signal.

However, alternatively, an output transducer may be configured to operably connect to the central region 3, e.g., such as to directly generate an electric signal indicative of the state of the resultant magnetic domain wall formed by the interaction of the input magnetic domain walls in the central region, e.g., without requiring an output magnetic bus to conduct the resultant magnetic domain wall from the central region to an output region for conversion into the electric signal in this output region.

For example, the plurality of magnetic buses may consist of an odd number of input magnetic buses 4, e.g., three input magnetic buses, and one output magnetic bus 5.

The magnetic majority gate device 1 further comprises at least one input transducer 6 for converting a digital input electrical signal into an input magnetic domain wall, at least one corresponding input site, such that a magnetization state of the input magnetic domain wall corresponds to a digital logic state of the digital input electrical signal. For example, the input transducer may be adapted for generating the input magnetic domain wall by using a spin transfer torque effect, and/or spin-orbit torque, induced by an electrical signal, e.g., a voltage, electrical current or electrical charge. The input transducer may be a magneto-electric cell or a magnetic tunnel junction. For example, to each of the input magnetic buses 4, a corresponding input transducer 6 may be coupled, e.g., electrically and/or physically coupled or connected, e.g., operably coupled and/or connected.

In some embodiments, each of the input and output transducers 6, 7 may comprises a discrete ferromagnetic nanopillar having an independent fixed layer and a tunnel barrier, such that each nanopillar forms a magnetic tunnel junction (MTJ). Thus formed MTJs of the input transducers 6 can be used to writing input states using spin transfer torque, and of the output transducer 7 can be used for reading out an output state based on the tunnel magnetoresistance. In the majority gate that is thus formed, domain walls generated by spin transfer torque or spin-polarized electrons propagate through the free ferromagnetic layer, thereby merging at a central region, to return an output state indicative of a majority selector.

The input transducer or each input transducer is adapted for injecting an in-plane electrical current into the input magnetic bus at the corresponding input site if, e.g., if and only if, the digital logic state is a predetermined digital logic state.

For example, the or each input transducer and an output transducer may be adapted for injecting an electrical current into the magnetic propagation layer between the corresponding input site and an output site of the output magnetic bus, if and only if the digital logic state transcoded by the input transducer corresponds to a predetermined digital logic state, e.g., an electronic digital logic "1" state transduced to a magnetic digital logic "UP" state.

Likewise, the or each output magnetic bus 5 may be coupled to an output transducer 7, such as a magnetic tunnel junction, for converting an output magnetic domain wall, e.g., a resultant magnetic domain wall formed by combining the input magnetic domain walls, into an output electrical signal. The output transducer 7 may be adapted for providing a current sink for an in-plane current when such in-plane current is injected by the input transducer.

However, instead of being provided with an input transducer, an input magnetic bus 4 may receive an input magnetic domain wall from an external source, e.g., from an output magnetic bus of another magnetic majority gate device 1 according to embodiments. Likewise, instead of being provided with an output transducer, an output magnetic bus 5 may be coupled to an external magnetic signal receiver, e.g., to an input magnetic bus of another magnetic majority gate device 1 in accordance with embodiments of the present disclosure.

For example, a device in accordance with embodiments of the present disclosure may receive two input magnetic domain walls at two input magnetic buses from an external source, e.g., from another similar spintronic device, and a third input magnetic domain wall may be generated at a third magnetic bus by an input transducer. However, a device in accordance with embodiments may equally comprise three input transducers operably connected to a corresponding three input magnetic buses for generating input magnetic domain walls in these input buses. It shall be clear that this can be generalized to a different (total) number of input magnetic buses and a different partition into input magnetic buses receiving an input wave from an external source and input magnetic buses having corresponding input transducers for generating such wave in situ.

Figure 6:
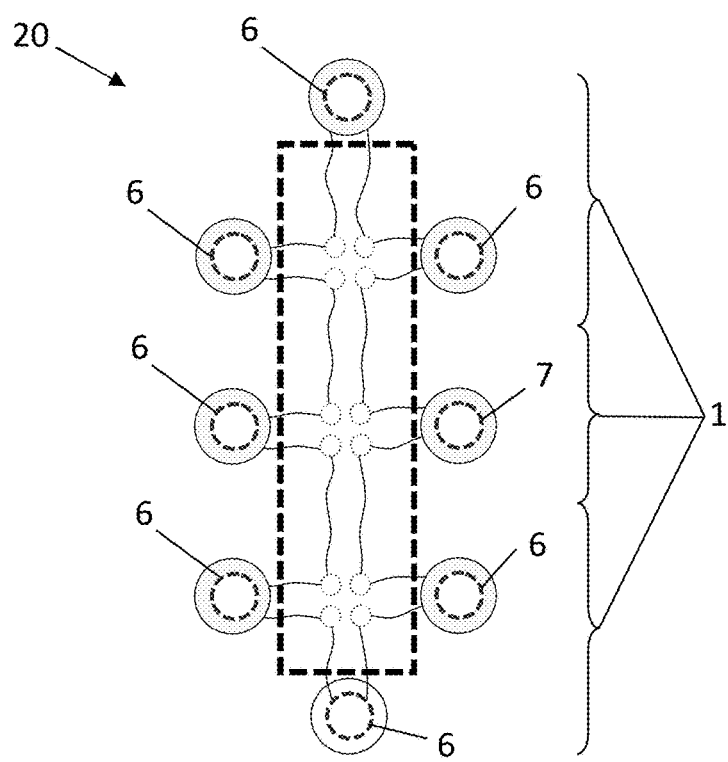
FIG. 6 shows a cascade arrangement of majority gate devices in accordance with embodiments of the present disclosure.

Referring to FIG. 6, a plurality of devices 1 in accordance with embodiments of the present disclosure may be interconnected to form a cascade device 20. In the example shown in FIG. 6, three magnetic majority gate devices 1 in accordance with embodiments of the present disclosure are interconnected, e.g., two such devices receive inputs via dedicated input transducers 6 on three input buses each and supply an output state directly in the form of a propagating magnetic domain wall as an input to the third magnetic majority gate device 1, at the center of the cascade device 20. This third magnetic majority gate device 1 thus received two input states directly as magnetic domain walls and has a third magnetic bus provided with another input transducer 6. This exemplary cascade device may thus report a majority state of seven inputs via a single output magnetic bus, where an output transducer 7 may be provided.

The magnetic propagation layer 2 further comprises a central region 3 in which the plurality of magnetic buses converge and are joined together such to allow an interaction of the input magnetic domain walls, e.g., an interaction of the input magnetic domain walls when received from the plurality of input sites via the corresponding input buses 4, and to allow a further propagation of a resultant magnetic domain wall formed by this interaction into the at least one output magnetic bus 5, e.g., toward at least one output site via the at least one corresponding output magnetic bus.

For example, the plurality of buses may be configured in a cross shape, as shown in FIG. 4 and FIG. 5, e.g., in which three input magnetic buses and one output magnetic bus are joined in the central region 3 forming a center of the cross. The plurality of magnetic buses may converge in the central region 3 such as to form a substantially right angle of a magnetic bus with respect to another magnetic bus, e.g., an angle in the range of 80 to 100 degrees, e.g., 90 degrees.

The central region 3 comprises at least one magnetic constriction 8 for locally restricting a propagation path of the propagating domain walls. Alternatively, a plurality of magnetic constrictions 8 may be arranged at or near corners, e.g., each magnetic constriction having a center (e.g., a geometric center or centroid) that is less than half, e.g., less than a quarter, of the width of the input magnetic bus removed from the corner, where the plurality of input magnetic buses are joined to form the central region 3. Alternatively, a plurality of magnetic constrictions 8 may be arranged at or near corners where the plurality of magnetic buses, e.g., the input and output magnetic buses, are joined to form the central region 3, e.g., as shown in FIG. 4.

The central region 3 comprises at least one magnetic constriction 8 for locally restricting a propagation path of the propagating domain walls. Alternatively, a plurality of magnetic constrictions 8 may be arranged at or near corners, e.g., each magnetic constriction having a center (e.g., a geometric center or centroid) that is less than 50% of the width of the input magnetic bus removed from the corner, where the plurality of input magnetic buses are joined to form the central region 3. For example, each magnetic constriction may have a center that is at a distance of less than or equal to 40% of this width removed from the corner, e.g., a distance of less than or equal to 25% of this width removed from the corner, e.g., a distance of less than or equal to 15% of this width removed from the corner, e.g., the center may be at a distance from the corner that lies in the range of 5% to 45% of the width of the input magnetic bus, or a distance in a range defined by any of these percentages. Alternatively, a plurality of magnetic constrictions 8 may be arranged at or near corners where the plurality of magnetic buses, e.g., the input and output magnetic buses, are joined to form the central region 3, e.g., as shown in FIG. 4.

For example, such magnetic constriction 8 may comprise a local non-magnetic inclusion in the magnetic propagation layer 2, a local dislocation in the crystallographic structure of the magnetic propagation layer 2 and/or a local cavity in the magnetic propagation layer 2. For example, a local cavity may comprise a concave indentation of the magnetic propagation layer, e.g., obtainable by physically removing the magnetic propagation material to create a local curvature of the propagation layer. However, such cavity is not necessarily gas-filled, but may, for example, be filled by a different material that locally prevents, delays and/or impedes magnetic propagation, for example, preferably, an electrically conductive material.

The magnetic constriction may comprise any artificial, e.g., purposefully introduced, material, design and/or effect for stopping, delaying and/or impeding a domain wall at a predefined position, corresponding to the magnetic constriction, in the magnetic propagation layer.

In some embodiments, the magnetic constriction 8 may be created by local ion irradiation of the magnetic propagation layer, e.g., to create a magnetically damaged region where electrical conductivity remains substantially unaltered. Ion irradiation may cause alteration of the magnetic propagation layer by introducing, e.g., point defects such as atomic vacancies or interstitials. The magnetic properties of the magnetic propagation layer may differ at the magnetic constriction(s) with respect to the magnetic properties of the bulk of the magnetic propagation layer, such that propagation of magnetic domain walls through the pinning site formed by the magnetic constriction(s) is impeded or prevented. For example, the magnetic constriction 8 may comprise a region of ion implantation to locally alter the magnetic properties of the magnetic propagation layer. Preferably, the electric properties of the magnetic propagation layer, e.g., the electrical conductivity, are unaltered, e.g., substantially the same in the magnetic constriction and in the bulk of the magnetic propagation layer.

For example, a magnetic constriction may comprise a locally confined region of, in and/or on the magnetic propagation layer, e.g., confined in the sense that it does not have a significant, substantial and/or non-negligible effect on magnetic and electric properties of the magnetic propagation layer at a distance to the center of this confined region that is larger than a distance threshold, e.g., than three times the diameter of the magnetic bus, e.g., larger than two times the diameter of the magnetic bus, e.g., larger than the diameter of the bus, e.g., larger than half the diameter of the bus. This locally confined region may have different magnetic properties than the bulk of the magnetic propagation layer, e.g., at a distance from the center of each such confined region that exceeds this distance threshold. The locally confined region may have similar or the same electric properties than the bulk of the magnetic propagation layer.

Thus, advantageously, a current injected by the at least one input transducer for driving the propagation of the input magnetic domain wall can pass through the magnetic constriction substantially unimpeded, while the magnetic domain wall is driven past the pinning site through a restricted cross-sectional area of the magnetic propagation layer. Therefore, a funnel effect may be achieved for forcing the interaction of different input magnetic domain walls in a constrained volume and/or area in the central region 3. For example, the current injected by the at least one input transducer may cause the magnetic domain wall to depin from a pinned position near the pinning site, thus causing a sudden movement of the domain wall and an efficient and complete interaction of the wave with other input waves in the central region.

To ensure that the majority magnetic domain propagates into the output magnetic bus, a release of the magnetic domain wall from the central region can be achieved by applying an in-plane current across the magnetic free layer. This in-plane current may create an additional spin torque acting on the magnetic domain wall. In order to ensure that only the majority domain propagates, the device may be configured for setting an initial magnetic state to a first predetermined magnetic state, e.g., the 'DOWN' state. Then, inputs which are switched to the second predetermined magnetic state, e.g., in the 'UP' state, and an in-plane current may be applied in the arms of these inputs pushing the second predetermined magnetic states toward the central region. The states forming the majority state, may then propagate to an output strip. In order to pass only the majority domain through the crossing point, at least one magnetic constriction is provided in the central region, e.g., forming a magnetic domain filter around the junction.

Figure 7:
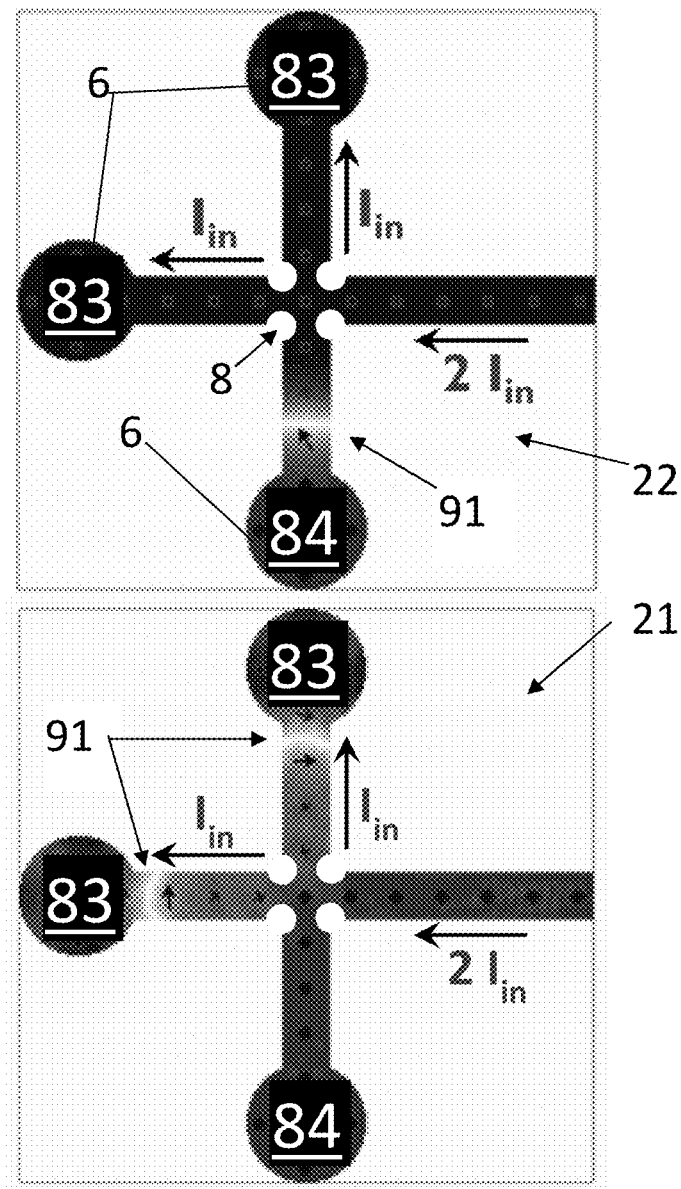
FIG. 7 illustrates the operation of a majority gate device in accordance with embodiments of the present disclosure.

Referring to FIG. 7, operation of the device 1 in accordance with embodiments of the present disclosure is shown. In this example, the magnetic propagation layer is initialized to a predetermined state, e.g., initialized to a magnetic state "DOWN". For example, an external field may be applied to perform such reset. Alternatively, the three input transducers 6 may be initialized to a magnetic state "DOWN". Then, two input transducers 6 receive, in an initialization step 21, an electrical input signal representative of a logical state "1", and generate in response a magnetic state "UP" 83, while another input transducer receives an electrical input signal representative of a logical state "0" 84. Then, the former two input transducers inject an in-plane current $-I_{in}$ in the corresponding input magnetic buses, resulting in a total current toward the output magnetic bus of $-2I_{in}$. After interaction of the domain walls 91 in the central region, the majority state domain wall propagates toward the output site, as shown in the final state representation 22.

Figure 8:
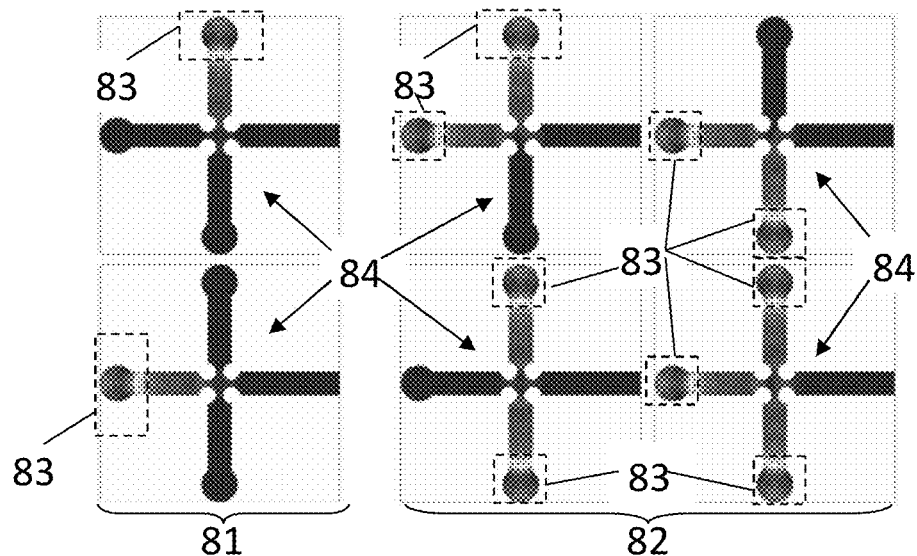
FIG. 8 shows micromagnetic simulations of various possible combinations of input states for an exemplary majority gate device in accordance with embodiments of the present disclosure, at a time instant immediately after transcoding the input states.
Figure 9:
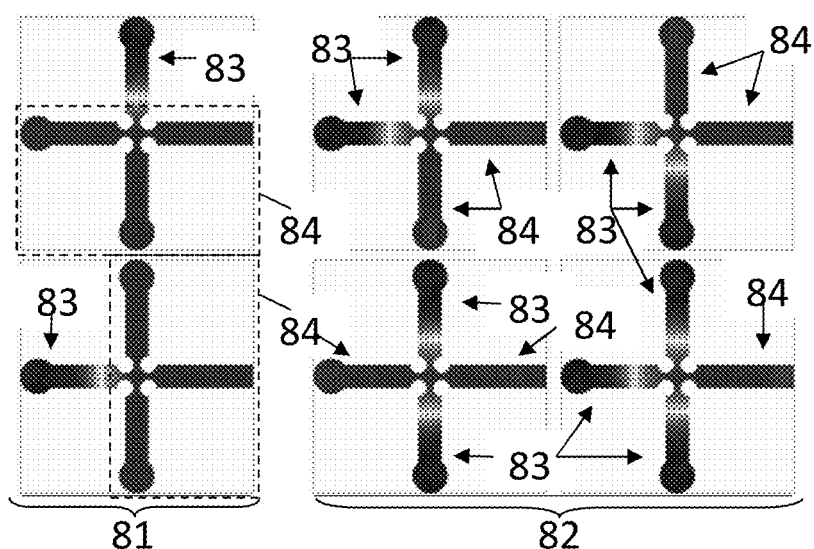
FIG. 9 shows micromagnetic simulations of various possible combinations of input states for an exemplary majority gate device in accordance with embodiments of the present disclosure, at a time instant corresponding to a few nanoseconds of propagation after switching.

The functionality of the device can be demonstrated for each possible combination of input states, as shown by the micromagnetic simulations illustrated in FIG. 8, FIG. 9 and FIG. 3. FIG. 8 shows magnetic states in the propagation layer immediately after input waves are generated using input switching by the input transducers. These examples illustrate an exemplary device having three input buses and a single output bus in a cross arrangement at right angles, adapted for magnetic signal processing in the form of propagating domain walls. FIG. 9 shows the magnetic state of the propagation layer after a few nanoseconds of propagation after switching. FIG. 3 shows magnetic states at the end of the simulations, e.g., in which a local equilibrium state is achieved over the propagation layer and the output bus has reached a final state representative of the majority domain over substantially its entire area. The left-most column 81 in FIG. 8, FIG. 9 and FIG. 3 shows two possible input combinations that correspond to a majority output state '0', while the two right columns 82 in FIG. 8, FIG. 9 and FIG. 3 show four possible input combinations that correspond to a majority output state '1'. In these drawings, the indicated part(s) 83 of the device has a magnetization representative of state '0', and the indicated part(s) 84 has a magnetization representative of state '1'.

Unlike a cross-shaped spin torque magnetic gate device as known in the art, e.g., as illustrated in FIG. 1, a device in accordance with embodiments of the present disclosure can operate reliably for critical dimensions larger than 20 nm. Furthermore, integration of such device is feasible without requiring complex material engineering and stack development. Backward propagation can be advantageously avoided in a magnetic majority gate device in accordance with embodiments, even for relatively large device dimensions, e.g., small devices relative to the scale of conventional electronic majority gate circuits, yet large relative to prior art magnetic majority gate devices such as shown in FIG. 1. Furthermore, cascading such device in accordance with embodiments can be easily achieved, since an output bus arm can be used as an input for a further magnetic majority gate device.

The magnetic state of a spin torque majority gate device, in accordance with embodiments of the present disclosure, may be initialized, in operation, to a single predetermined state, e.g., either an 'UP' or 'DOWN' state. The input buses may then receive a signal in the form of propagating domain walls. These input signals may be provided, e.g., for at least one or for each input bus by an input transducer. For example, an electrical input signal, e.g., a logic '1' or '0' signal, may cause a switching of the propagation layer at an input site, for example by application of an external field, a spin-transfer torque, a spin-orbit torque, a magneto-electric effect, a spin caloritronic method and/or a similar transducer effect. An electrical in-plane current may be applied, e.g., where an input corresponded to a predetermined state, e.g., a logical '1', such that electrons may flow from the switched input sites to an output site, or equivalently, in the opposite direction, depending on an arbitrary yet predetermined choice of current sense. Thus, a torque may be applied on the domain walls propagating through the propagation layer. For example, a spin transfer torque and/or a spin-orbit torque may be applied. Due to this torque, the switched domains may be actively pushed in the direction of the output. However, the at least one magnetic constriction 8 near or in the central region 3 may cause the propagating domain walls to stop at the pinning site formed thereby. For example, if only one domain wall has been nucleated, it may stop at the pinning site without further propagating to the output magnetic bus. However if two or more domain walls were created, these may merge and pass through the central region toward the output magnetic bus due to the in-plane current.

By applying a torque on the generated domain walls, these domain walls are pushed in the direction of the output. If only a single domain wall has been nucleated, it may thus be stopped by the at least one magnetic constriction, e.g., by the pinning site formed by the at least one magnetic constriction, near or in the central region, e.g., by magnetic constrictions placed around a crossing of the input and output buses. Therefore, a single domain wall, e.g., in the absence of other generated domain walls, would not propagate to the output strip. However if two or more domain walls have been created, these domain walls can merge in the central region and pass through the central region. Particularly, two domain walls can merge if they can exert a substantial influence on each other, e.g., if the distance between them is smaller than a few times the domain wall width. Therefore, the magnetic constrictions may be located in close proximity to each other and in or near the central region, e.g., located around the center (e.g., the geometrical center) of the central region, which may be formed by crossing magnetic buses. The merged domain walls may then propagate to the output, driven by the in-plane current.

For example, below a predetermined threshold current $I_t$, a domain wall may be pinned at the pinning site(s). The in-plane electrical current $I_{in}$ that is injected into the input magnetic bus where the logic state corresponds to the predetermined digital logic state (e.g., "1"), e.g., the in-plane electrical current generated between the output magnetic bus and an input magnetic bus where the domain wall is generated (e.g., corresponding to a state "1"), may be selected, e.g., for a setup having three input magnetic buses, such that $I_t/2 < I_{in} < I_t$. The example of a configuration of three input magnetic buses and one output magnetic bus will be used hereinbelow, embodiments of the present invention not being limited thereto.

Since the injected in-plane current per generated domain wall is smaller than $I_t$, an isolated domain wall is pinned by the pinning site(s), e.g., pinned when reaching, or before reaching, the central region. In the output magnetic bus, the injected in-plane currents may combine, e.g., the output magnetic bus may form a common terminal for the injected in-plane currents, e.g., a common current sink or source complementing the current source or sink in each active input magnetic bus. Thus, at the output side of the central region, e.g., at a central end of the output magnetic bus, the current $I_{out}$ may be substantially equal to the sum of the currents in each input. For example, if no domain wall has been nucleated, $I_{out}$ may be substantially equal to 0. If a single domain wall has been nucleated, $I_{out}$ may be substantially equal to $I_{in}$. If two domain walls have been nucleated, $I_{out}$ may be substantially equal to $2I_{in}$. If three domain walls have been nucleated, $I_{out}$ may be substantially equal to $3I_{in}$. Therefore, when two or more domain walls have been nucleated in the input magnetic buses, they merge at the crossing. In the central region, near the output magnetic bus, a magnetic constriction or magnetic constrictions may also be provided, as shown in FIG. 4. When the two or more domain walls jointly reach the output pinning site, the combined domain walls can propagate to the output magnetic bus to fill the output magnetic bus with the switched domain, since in this case, $I_{out} \geq 2I_{in} > 2I_t$. Consequently, when, e.g., if and only if, the switched domain is the majority domain, it may propagate to the output. On the other hand, when it is not the majority domain, it does not pass through the center and the output strip remains in its initial magnetic orientation, which is majority. Therefore, the majority domain will consistently propagate to the output, as expected.

For a configuration having an arbitrary odd number n of input magnetic buses, the in-plane electrical current may therefore advantageously be selected as less than the predetermined threshold current $I_t$ divided by (n−1)/2, and more than the predetermined threshold current $I_t$ divided by (n+1)/2, e.g., such that $2I_t/(n+1) < 2I_t/(n-1)$.

The magnetic constrictions 8 may be formed by pairs of notches that are conductive but not magnetic, e.g., having a saturation magnetization that is substantially equal to zero, e.g., $M_s = 0$. Below a threshold current $I_t$, a domain wall may be pinned. The in-plane current $I_{in}$ in the input magnetic buses, may be selected such that $I_t/2 < I_{in} < I_t$. Since it is smaller than $I_t$, domain walls may be pinned before reaching the central region 3. After the central region 3, at the start of the output magnetic bus, the current $I_{out}$ may be substantially equal to the sum of the currents in each input bus. If no domain wall has been nucleated, $I_{out}$=0. If one domain wall has been nucleated, $I_{out}$=$I_{in}$. If two DWs have been nucleated, $I_{out}$=2$I_{in}$. If three domain walls have been nucleated, $I_{out}$=3$I_{in}$. As mentioned previously, when two or more domain walls have been nucleated at the inputs, they merge at the crossing. Then, they may reach the output pinning site. In that case, $I_{out}$≥2$I_{in}$>2$I_t$. Therefore, the DW propagates to the output strip filling it with the switched domain. Consequently, when the switched domain is majority, it propagates to the output. On the other hand, when it is not majority, it does not pass through the center and the output strip remains in its initial magnetic orientation, which is majority. Therefore, the majority domain may always propagate to the output, as expected.

In a second aspect, the present disclosure also relates to a method for operating a magnetic majority gate device in accordance with embodiments of the first aspect of the present disclosure. This method comprises initializing the plurality of input buses to a first predetermined magnetization state, e.g., a 'DOWN' state. The method further comprises providing the digital input electrical signal to the at least one input transducer 6 to generate an input magnetic domain wall at an input site if the digital logic state of the corresponding digital input electrical signal equals a first predetermined logic state, e.g., such that the magnetization state of the input bus is switched from a 'DOWN' state, as initialized, to an 'UP' state to locally generate a domain wall. Thus, the input bus(es) that conducts a propagating domain wall, after this step, correspond to the predetermined digital logic state of the digital input electrical signal, e.g., a logic state "1". The input bus(es) that does not conduct a propagating domain wall, after this step, corresponds to the conjugate of the predetermined digital logic state, e.g., a logic state "0".

The method also comprises injecting the in-plane electrical current into the input magnetic bus at the corresponding input site if the digital logic state corresponds to the predetermined digital logic state, e.g., injecting an in-plane current into the input bus if the logic state "1" generated a domain wall to propel the domain wall toward to central region 3.

For example, the in-plane electrical current may generated between the corresponding input site and an output site, e.g., between the input magnetic bus and at least the central region of the device, e.g., between the input magnetic bus and an output magnetic bus of the device. The injected in-plane electrical current $I_{in}$ may selected such that $2I_t/(n+1) < I_{in} < 2I_t/(n-1)$, in which $I_t$ refers to a threshold current for overcoming a pinning condition of the at least one pinning site, and n refers to the number of input magnetic buses of the device.

A magnetic majority gate device in accordance with embodiments of the first aspect of the present disclosure may comprise a controller, e.g., an integrated circuit, for providing a method in accordance with embodiments of this second aspect. For example, such controller may comprise a supporting integrated circuit or supporting electronics for operating the magnetic majority gate device in accordance with embodiments of the first aspect of the present disclosure, for example, to provide synchronization, for supplying the input signals, for collecting the output signal(s), and/or for executing a control sequence or control loop, e.g., comprising the sequential execution of reset, input and output processing.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A magnetic majority gate device, comprising:
   a magnetic propagation layer comprising a plurality of magnetic buses configured to guide propagating magnetic domain walls along longitudinal directions corresponding to elongated directions of the magnetic buses,
   wherein the plurality of magnetic buses comprises a plurality of input magnetic buses, each of the input magnetic buses having a corresponding input site configured to receive a corresponding input magnetic domain wall; and
   at least one input transducer at a corresponding input site configured to convert a digital input electrical signal into an input magnetic domain wall, such that a magnetization state of the input magnetic domain wall corresponds to a digital logic state of the digital input electrical signal,
   wherein the at least one input transducer is configured to inject an in-plane electrical current into the corresponding input magnetic bus if the digital logic state is a predetermined digital logic state,
   wherein the magnetic propagation layer comprises a central region at which the magnetic buses converge and are joined together, such that the central region is configured for an interaction of input magnetic domain walls guided by two or more magnetic buses, and
   wherein the central region comprises at least one magnetic constriction configured to locally restrict propagation of propagating magnetic domain walls.

2. The magnetic majority gate device of claim 1, comprising a plurality of magnetic constrictions formed at corners where the plurality of magnetic buses are joined to form the central region.

3. The magnetic majority gate device according to claim 1, wherein the at least one magnetic constriction comprises a local non-magnetic inclusion in the magnetic propagation layer, a local dislocation in the crystallographic structure of the magnetic propagation layer and/or a local cavity in the magnetic propagation layer.

4. The magnetic majority gate device according to claim 1, wherein the at least one magnetic constriction comprises a local region formed by ion irradiation of the magnetic propagation layer.

5. The magnetic majority gate device according to claim 1, wherein the magnetic buses include an odd number of input magnetic buses and at least one output magnetic bus, wherein the central region of the magnetic propagation layer is further configured to further propagate a resultant magnetic domain wall formed by the interaction of the input magnetic domain walls into the at least one output magnetic bus.

6. The magnetic majority gate device according to claim 5, wherein the at least one output magnetic bus consists of one output magnetic bus and the plurality of input magnetic buses consists of three input magnetic buses, wherein the plurality of buses are configured in a cross shape, wherein the three input magnetic buses and the one output magnetic bus are joined at the central region forming a center of the cross shape.

7. The magnetic majority gate device according to claim 6, further comprising at least one output transducer for converting the resultant magnetic domain wall into an output electrical signal, wherein the output magnetic bus is coupled to a corresponding output transducer.

8. The magnetic majority gate device according to claim 1, wherein the plurality of magnetic buses comprises a plurality of nanostrips and/or nanowires.

9. The magnetic majority gate device according to claim 1, wherein the magnetic propagation layer comprises a ferromagnetic, ferrimagnetic and/or anti-ferromagnetic free layer on a substrate.

10. The magnetic majority gate device according to claim 1, further comprising a tunnel barrier layer formed on the magnetic propagation layer, and wherein the magnetic propagation layer is formed on a substrate, such that the propagating magnetic domain walls are isolated in the magnetic propagation layer.

11. The magnetic majority gate device according to claim 1, wherein each of the magnetic buses has a width (W) in a range of 10 nm to 100 nm.

12. The magnetic majority gate device according to claim 1, wherein the at least one input transducer is configured to generate the input magnetic domain wall by spin transfer torque effect induced by an electric field.

13. The magnetic majority gate device according to claim 1, wherein at least one of the input magnetic buses is configured to receive an input magnetic domain wall from an output magnetic bus of another magnetic majority gate device.

14. The magnetic majority gate device according to claim 1, wherein magnetic propagation layer comprises a Co alloy and has a magnetization direction perpendicular to the longitudinal directions.

15. A method for operating a magnetic majority gate device according to claim 1, the method comprising:
    initializing the plurality of input buses to a first predetermined magnetization state;
    providing the digital input electrical signal to the at least one input transducer to generate the input magnetic domain wall at each corresponding input site where the digital input electrical signal corresponds to a predetermined digital logic state; and
    injecting the in-plane electrical current into the input magnetic bus at the corresponding input site if the digital input electrical signal corresponds to the predetermined digital logic state.

16. A magnetic majority gate device, comprising:
    a magnetic propagation layer comprising a plurality of magnetic strips that are formed of a common ferromagnetic free layer and are connected at a central region and extend laterally outward therefrom, wherein the magnetic propagation layer comprises a plurality of constricted regions each comprising a magnetically inactive region formed at the central region; and
    a transducer comprising a magnetic tunnel junction (MTJ) formed on each of the magnetic strips laterally outside of the central region, wherein the MTJ comprises a dielectric tunnel barrier and a ferromagnetic fixed layer, such that the transducer is configured to convert electric field to a domain wall by tunneling spin-filtered electrons through the dielectric tunnel barrier.

17. The magnetic majority gate device of claim 16, wherein the magnetic strips include a plurality of input magnetic strips each configured to tunnel in spin-filtered electrons through a respective MTJ and to propagate a magnetic domain wall resulting therefrom towards the central region, and wherein the magnetic strips further include an output strip configured to propagate a magnetic domain wall from the central region and to tunnel out spin filtered electrons through the respective MTJ of the output strip.

18. The magnetic majority gate device of claim 16, wherein each of the constricted regions is formed at a corner region formed at an intersection of two magnetic strips.

19. The magnetic majority gate device of claim 16, wherein at least one of the constricted regions comprises a crystal dislocation in the magnetic propagation layer or a cavity in the magnetic propagation layer.

20. The magnetic majority gate device of claim 16, wherein at least one of the constriction regions comprises an ion-irradiated region of the magnetic propagation layer.

* * * * *

UNITED STATES PATENT AND TRADEMARK OFFICE
CERTIFICATE OF CORRECTION

PATENT NO. : 10,164,077 B2
APPLICATION NO. : 15/693243
DATED : December 25, 2018
INVENTOR(S) : Adrien Vaysset Page 1 of 1

It is certified that error appears in the above-identified patent and that said Letters Patent is hereby corrected as shown below:

In the Specification

Column 16, Line 57 (approx.), delete "$2I_t/(n+1)<2I_t/(n-1)$." and insert --$2I_t/(n+1)<I_{in}<2I_t/(n-1)$.--.

Signed and Sealed this
Third Day of March, 2020

Andrei Iancu
*Director of the United States Patent and Trademark Office*